United States Patent [19]
Kajigaya et al.

[11] Patent Number: 5,151,881
[45] Date of Patent: Sep. 29, 1992

[54] SEMICONDUCTOR MEMORY INCLUDING AN ARRANGEMENT TO PERMIT EXTERNAL MONITORING OF AN INTERNAL CONTROL SIGNAL

[75] Inventors: Kazuhiko Kajigaya, Ohme; Jiro Sawada, Kokubunji, both of Japan

[73] Assignee: Hitachi, Ltd., Tokyo, Japan

[21] Appl. No.: 485,406

[22] Filed: Apr. 25, 1988

[30] Foreign Application Priority Data
Apr. 24, 1987 [JP] Japan .................................. 62-99777

[51] Int. Cl.$^5$ ...................... G11C 7/00; G11C 11/412
[52] U.S. Cl. ................ 365/233; 365/189.03; 365/230.08; 365/189.05; 365/201
[58] Field of Search .............. 365/201, 189, 230, 233, 365/189.03, 230.08, 189.05; 371/21

[56] References Cited

U.S. PATENT DOCUMENTS

| | | | |
|---|---|---|---|
| 4,603,405 | 7/1986 | Michael | 365/201 |
| 4,608,669 | 8/1986 | Klara et al. | 365/201 |
| 4,635,233 | 1/1987 | Matsumoto et al. | 365/189 X |
| 4,660,180 | 4/1987 | Tanimura et al. | 365/230 X |
| 4,703,453 | 10/1987 | Shinoda et al. | 365/201 X |

FOREIGN PATENT DOCUMENTS
62-250593 10/1987 Japan .................................. 365/201

OTHER PUBLICATIONS
"Hitachi IC Memory Data Book" Hitachi Ltd. Sep. 1983 pp. 251-259.

*Primary Examiner*—Alyssa H. Bowler
*Attorney, Agent, or Firm*—Antonelli, Terry, Stout & Kraus

[57] ABSTRACT

A semiconductor memory comprises a memory array including a plurality of memory cells, a peripheral circuit which executes either an information write or read operation with respect to one or more memory cells selected from the plurality of memory cells, a timing control circuit which forms at least one internal control signal for controlling the peripheral circuit, and at least one external terminal for delivering said at least one internal control signal to the outside of the semiconductor memory. For example, the peripheral circuit can include an arrangement to permit the peripheral circuit to operate in a test mode to deliver the internal control signal to the external terminal to allow external testing of the operation of the internal control signal.

30 Claims, 4 Drawing Sheets

SEMICONDUCTOR MEMORY INCLUDING AN ARRANGEMENT TO PERMIT EXTERNAL MONITORING OF AN INTERNAL CONTROL SIGNAL

BACKGROUND OF THE INVENTION

The present invention relates to a semiconductor memory and, more particularly, to a technique which may be applied to semiconductor memories, for example, dynamic type RAMs (Random Access Memories) or the like.

One type of dynamic RAM has a timing control circuit (i.e., a timing generating circuit). This timing control circuit forms timing signals and internal control signals which are used to control the operation of each circuit block in a dynamic type RAM on the basis of a plurality of control signals which are supplied externally.

The dynamic type RAM that has a timing control circuit is described, for example, in "Hitachi IC Memory Data Book", Hitachi, Ltd., Sept. 1983, pp. 251–259.

The dynamic RAM of the type described above is provided with a plurality of external terminals through which are inputted and outputted the above-described control signals, address signals, storage data or the like. The number of these external terminals installed is minimized, so that there is no room to provide external terminals for outputting the states of signals transmitted to internal nodes in a control circuit such as the above-described timing control circuit, that is, timing signals, internal control signals or the like. Accordingly, functional testing that is carried out to confirm the operation of the timing control circuit must be realized by repeating an indirect method that an appropriate memory cell is actually brought into a select state and a predetermined write or read operation is executed in relation to this memory cell to judge whether or not the write or read operation has been successfully effected.

Semiconductor memories such as dynamic type RAMs tend to be provided with highly advanced functions and multifunctional properties and, as a result, the circuit configuration of a control circuit, for example, the above-described timing control circuit, is increasingly complicated. Further, as a result of the achievement of highly advanced and multifunctional semiconductor memories such as dynamic type RAMs, there has been an increase in the number of product testing items. Accordingly, when the above-described conventional testing method is adopted as it is, a disadvantageously long testing time is required, and it may be impossible to inspect a special additional function. In addition, despite the complexity of the control circuits, e.g., the above-described timing control circuit, it is impossible to externally confirm the states of signals transmitted to internal nodes in the control circuits. This leads to the problem that it is impossible to accurately carry out failure analysis and measurement of operating margin or the like after the completion of products. Even when write data and read data are coincident with each other and therefore the result of a test carried out on the basis of the conventional testing method is judged to be normal, there may be a small defect which may cause a failure. For example, the waveform of a predetermined internal signal measured after the completion of a product may discord with the waveform expected at the time of designing. The inventors of the present invention have found that a small defect such as that described above leads to a failure such as erroneous reading of stored data, when, for example, the use conditions of the product become worse. Accordingly, it is necessary to measure the waveform of an internal signal after the completion of each product.

SUMMARY OF THE INVENTION

It is an object of the present invention to provide a semiconductor memory, for example, a dynamic type RAM, which is so designed that it is possible to externally confirm the state of a signal which is transmitted to a predetermined internal node in a memory array peripheral circuit.

It is another object of the present invention to enable a semiconductor memory, for example, a dynamic type RAM, to be efficiently subjected to a functional test or the like to thereby reduce the time required for such a test.

The above and other objects and novel features of the present invention will become clear from the following description taken in conjunction with the accompanying drawings.

A typical one of the inventions disclosed in this application will be summarized below.

Namely, a semiconductor memory is arranged such that a signal transmitted to a predetermined internal node in a timing control circuit or other similar circuit, i.e., a timing signal or an internal control signal, can be output from a predetermined external terminal in a predetermined operation mode of the memory.

By virtue of the above-described arrangement, it is possible to confirm the state of a signal transmitted to a predetermined internal node of a timing control circuit or the like by setting the semiconductor memory in the predetermined operation mode. It is therefore possible to efficiently carry out failure analysis and measurement of operating margin or the like.

DESCRIPTION OF THE PREFERRED EMBODIMENTS

Figure 1:
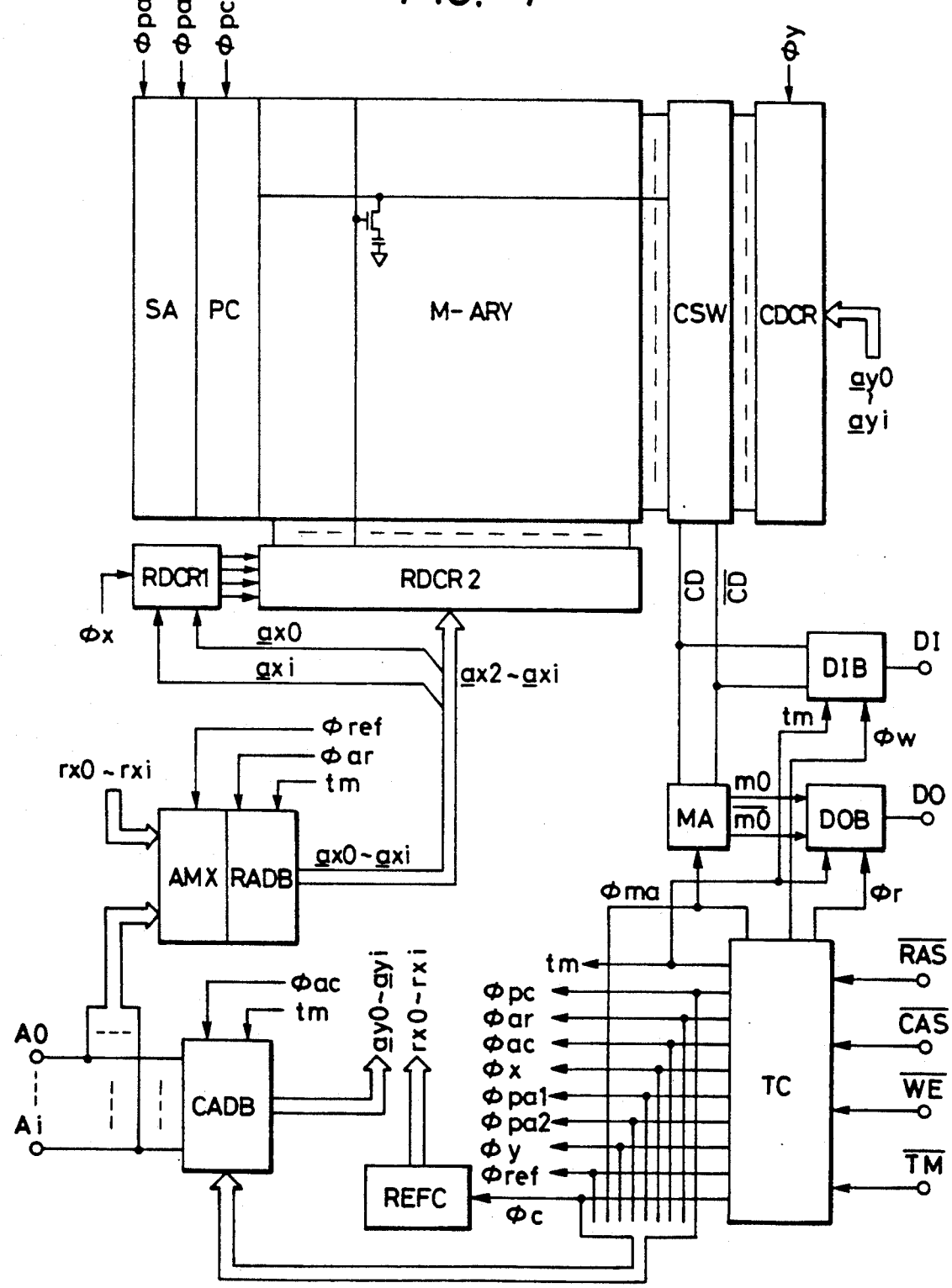
FIG. 1 is a block diagram of one embodiment of the present invention in which the invention is applied to a dynamic

FIG. 1 is a block diagram of one embodiment of the present invention in which the invention is applied to a dynamic type RAM. Circuit elements which constitute the circuit blocks shown in FIG. 1 are fabricated on a single semiconductor substrate, for example, single crystal silicon, by the known CMOS (Complementary MOS) integrated circuit manufacturing technique, although not necessarily limited thereto.

Figure 4:
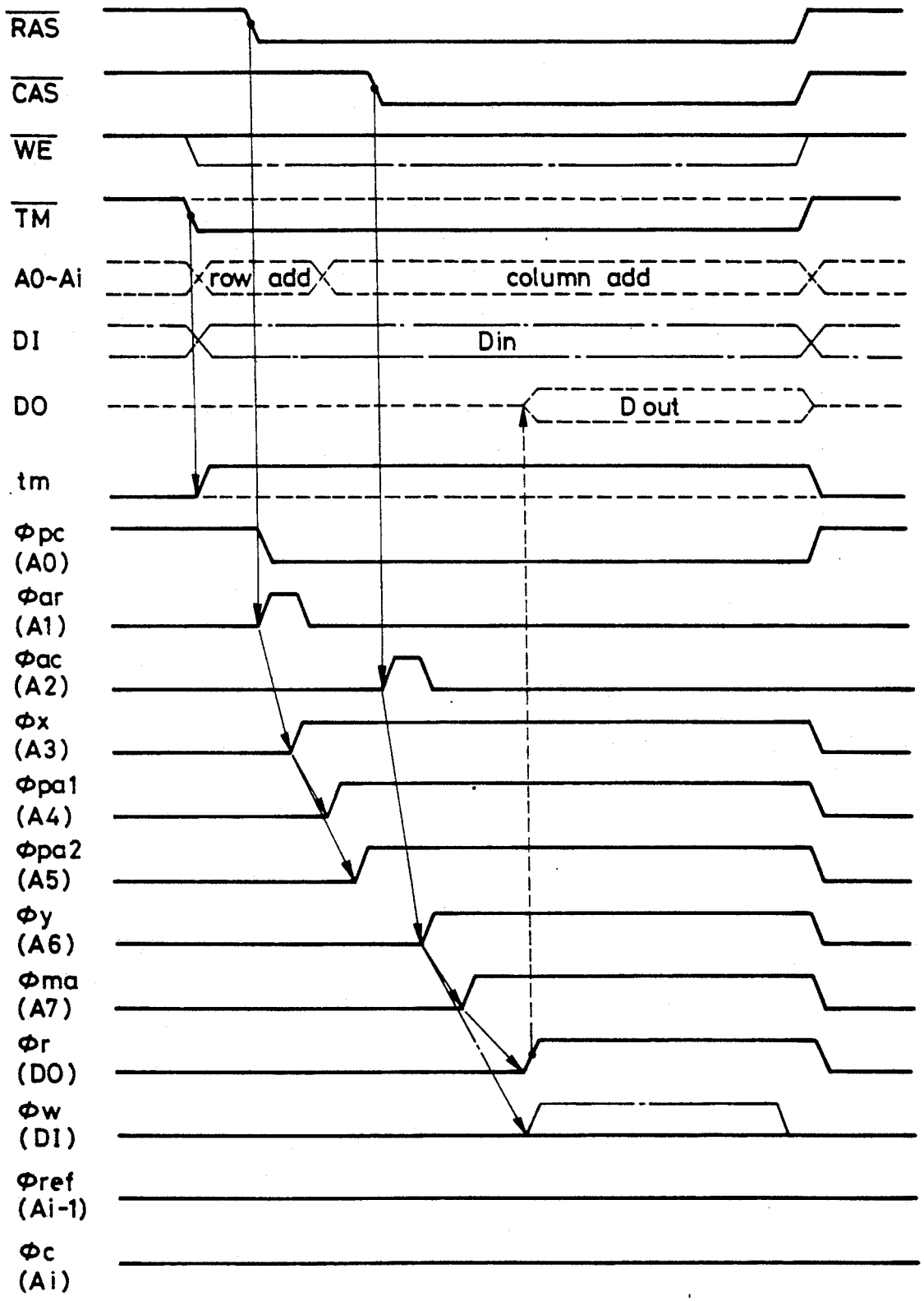
FIG. 4 a timing chart showing one example of the operation of the dynamic type RAM shown in FIG. 1.

FIG. 4 is a timing chart showing one example of the operation of the dynamic type RAM according to this embodiment. In FIG. 4, a test mode of the dynamic type RAM is shown by the solid line, while a normal read operation mode is shown by the chain line, and a normal write operation mode is shown by the one-dot chain line. Reference should be made to the timing chart of FIG. 4 when the following description of the embodiment is read.

The dynamic type RAM of this embodiment is provided with a timing control circuit TC which is supplied with control signals, i.e., a row address strobe signal $\overline{RAS}$, a column address strobe signal $\overline{CAS}$ and a write enable signal $\overline{WE}$, from an external device and which forms various timing signals and internal control signals used to control the operation of each circuit on the basis of the external control signals. The dynamic type RAM is further provided with a function whereby signals which are transmitted to predetermined internal nodes, for example, various timing signals formed by the timing control circuit TC, are delivered from predetermined external terminals in a predetermined testing mode (described later in detail), thereby achieving an efficient testing operation. The external terminals are those which are provided for the purpose of electrically connecting predetermined nodes in the semiconductor integrated circuit and devices which are provided outside a package for protecting the semiconductor integrated circuit. For this purpose, the dynamic type RAM of this embodiment is provided with an external terminal TM for inputting a test mode signal $\overline{TM}$ which designates the test mode. The test mode signal $\overline{TM}$ is raised to a high level in a normal operation mode and selectively changed to a low level in the test mode by a testing device which is connected externally. When the test mode signal $\overline{TM}$ is shifted to the low level, a plurality of timing signals output from the timing control circuit TC are supplied to various circuits through normal signal paths and also delivered to the external testing device through external address terminals A0 to Ai, an external terminal used to input data, that is, a data input terminal DI, and an external terminal used to output data, that is, a data output terminal DO.

In FIG. 1, a memory array M-ARY is arranged on the basis of the folded-bit cell (folded-bit line) system and composed of n-1 pairs of complementary data lines disposed horizontally as viewed in the figure, m-1 word lines disposed vertically as viewed in the FIGURE, and (m+1) × (n+1) dynamic type memory cells respectively disposed at the intersections between the complementary data and word lines in a matrix configuration, although not necessarily limited thereto.

Each pair of complementary data lines constituting the memory array M-ARY is coupled at one end thereof to a precharge circuit PC and further coupled to the corresponding unit circuit in a sense amplifier SA. The precharge circuit PC consists of n+1 switching MOSFETs for short-circuiting between a non-inverting signal line and an inverting signal line which constitute each pair of complementary data lines. The gates of these switching MOSFETs are mutually connected and supplied with a timing signal $\phi$pc from the timing control circuit TC (described later). The timing signal $\phi$pc is raised to a high level when the dynamic type RAM is in a non-select state, and changed to a low level when the RAM is in a select state. When the dynamic type RAM is brought into a non-select state, all the switching MOSFETs constituting the precharge circuit PC are simultaneously turned ON to short-circuit the two signal lines constituting each pair of complementary data lines, thereby bringing the signal lines to a half-precharge level, that is, about a half of a power supply voltage Vcc. Thus, when the dynamic type RAM is brought into a select state, the level of each of the non-inverting and inverting signal lines of each pair of complementary data lines is changed toward either a high or low level from the half-precharge level, so that it is possible to achieve a high-speed read operation.

The sense amplifier SA consists of n+1 unit circuits which are provided in correspondence with the pairs of complementary data lines. Each unit circuit of the sense amplifier SA consists basically of a flip-flop which is composed of two CMOS inverter circuits which are cross-coupled to each other. Input/output nodes of the unit circuit are coupled to the non-inverting and inverting signal lines, respectively, of the corresponding pair of complementary data lines. These unit circuits of the sense amplifier SA are selectively activated in response to timing signals $\phi$pal and $\phi$pa2 which are supplied from the timing control circuit TC and which are raised to a high level with a slight time difference, so as to perform a two-stage amplifying operation. A minute read signal is read out from a memory cell coupled to a selected word line and output to the corresponding pair of complementary data lines. The read signal is then amplified by the corresponding unit circuit in the sense amplifier SA without any sudden fluctuation in level and converted into a binary signal of either high or low level.

Each pair of complementary data lines constituting the memory array M-ARY is coupled at the other end thereof to the corresponding switching MOSFET in a column switch CSW. The column switch CSW consists of n+1 pairs of switching MOSFETs which are provided in correspondence with the pairs of complementary data lines. One of each pair of switching MOSFETs is coupled to the corresponding pair of complementary data lines, and the other is mutually connected to either a non-inverting signal line CD or an inverting signal line $\overline{CD}$ which constitute a pair of complementary common data lines. The gates of the two switching MOSFETs that constitute each pair are mutually connected and supplied with the corresponding one of the data line select signals Y0 to Yn from a column addressdecoder CDCR. Thus, the column switch CSW selectively connects a pair of complementary data lines designated by column address signals, that is, the data line select signals Y0 to Yn, to the common complementary data lines CD and $\overline{CD}$.

The column address decoder CDCR decodes complementary internal address signals ay0 to aVi (herein, for example, an internal address signal $\overline{ay0}$ which is in-phase with an external address signal AY0 and an internal address signal ay0 which is anti-phase with it are expressed in combination by a complementary internal address signal $\overline{ay0}$; the same rule applies to the following description) which are supplied from a column address buffer CADB, forms the above-described data line select signals Y0 to Yn in synchronism with a timing signal $\phi$y supplied from the timing control circuit TC, and supplies them to the corresponding switching MOSFETs in the column switch CSW.

The column address buffer CADB incorporates and holds Y-address signals AY0 to AYi which are supplied through external terminals A0 to Ai, forms the above-described complementary internal address signals ay0 to ayi on the basis of the Y-address signals AY0 to AYi, and supplies them to the column address decoder CDCR. The column address buffer CADB further functions to deliver to the outside various timing signals formed by the timing control circuit TC through the corresponding external terminals A0 to Ai. For this purpose, the column address buffer CADB is provided with i+1 input circuits IC0 to ICi, address latches AL0 to ALi and i-l output circuits OC0 to OCi in correspondence with the external terminals A0 to Ai (e.g. see FIG. 2).

The column address buffer CADB is supplied with a timing signal $\phi ac$ and an internal control signal tm. The timing signal $\phi ac$ is usually placed at a low level and, when the column address strobe signal $\overline{CAS}$ is changed from a high level to a low level, the timing signal $\phi ac$ is temporarily raised to a high level. The internal control signal tm is placed at a low level when the dynamic type RAM is in a normal operation mode and, when the test mode signal $\overline{TM}$ is changed to the low level and the dynamic type RAM is thereby brought into a predetermined test mode, the internal control signal tm is selectively raised to a high level. In other words, the dynamic type RAM of this embodiment adopts the address multiplex system, and therefore the Y-address signals AY0 to AYi are supplied to the external terminals A0 to Ai in synchronism with the fall edge of the column address strobe signal $\overline{CAS}$. Further, when the dynamic type RAM is set in a predetermined test mode, predetermined timing signals are output to the external 5 terminals A0 to Ai. When the internal control signal tm is set at the low level and the dynamic type RAM is thereby set in a normal operation mode, the input circuits IC0 to ICi in the column address buffer CADB transmit the Y-address signals AY0 to AYi supplied through the external terminals A0 to Ai to the corresponding address latches AL0 to ALi. When, in this normal operation mode, the timing signal $\phi ac$ is temporarily raised to the high level, the address latches AL0 to ALi in the column address buffer CADB are allowed to incorporate and hold the Y-address signals AY0 to AYi transmitted from the corresponding input circuits. On the other hand, when the internal control signal tm is raised to the high level and the dynamic type RAM is thereby set in a predetermined test mode, the output circuits OC0 to OCi in the column address buffer CADB deliver timing signals $\phi pc$, $\phi ar$, $\phi ac$, $\phi x$, $\phi pal$, $\phi pa2$, $\phi y$, $\phi ma$, $\phi ref$ and $\phi c$ output from the timing control circuit TC to an external testing device through the corresponding external terminals A0 to Ai.

A specific arrangement and operation of the column address buffer CADB will be described later in detail.

The word lines that constitute the memory array M-ARY are coupled to a secondary row address decoder RDCR2 so that one of them is selected and designated by the decoder RDCR2. Although not necessarily limiting, the row selection circuit of the dynamic type RAM according to this embodiment has a two-stage structure and is therefore provided with a primary row address decoder RDCR1 which decodes two low-order bits of the row address signal, i.e., complementary internal address signals $ax0$ and $ax1$, and a secondary row address decoder RDCR2 which decodes the other complementary internal address signals $ax2$ to $axi$.

The primary row address decoder RDCR1 decodes the two low-order bit complementary internal address signals $ax0$ and $ax1$ supplied from a row address buffer RADB, although not necessarily limited thereto, and forms word line select timing signals $\phi x0$ to $\phi x3$ in accordance with the timing signal x supplied from the timing control circuit TC. These word line select timing signals $\phi x0$ to $\phi x3$ are supplied to the secondary row address decoder RDCR2. The secondary row address decoder RDCR2 decodes the complementary internal address signals $ax2$ to $axi$ supplied from the row address buffer RADB. Further, the secondary row address decoder RDCR2 combines the result of decoding with the word line select timing signals $\phi x0$ to $\phi x3$ supplied from the primary row address decoder RDCR1 to thereby selectively bring one word line designated by the row address signal into a select state of high level.

The above-described two-stage arrangement of the row select circuit enables the pitch of the secondary row address decoder RDCR2 on the semiconductor substrate to be substantially equal to the pitch of the word lines in the memory array M-ARY. Thus, it is possible to achieve efficient layout of the semiconductor substrate.

The row address buffer RADB receives the row address signal transmitted from an address multiplexer AMX and forms complementary internal address signals $ax0$ to $axi$. These complementary internal address signals $ax0$ to $axi$ are supplied to the above-described primary and secondary row address decoders RDCR1 and RDCR2. As described above, the X-address signals AX0 to AXi are supplied synchronously with the fall edge of the row address strobe signal $\overline{RAS}$. Therefore, the row address buffer RADB is supplied with the timing signal $\phi ar$ from the timing control circuit TC, the signal $\phi ar$ being formed when the fall of the row address strobe signal $\overline{RAS}$ is detected. When the timing signal $\phi ar$ is temporarily raised to a high level, the row address buffer RADB incorporates the X-address signals AX0 to AXi supplied from the external terminals A0 to Ai through an address multiplexer AMX.

In an automatic refresh mode in which the timing signal $\phi ref$ supplied from the timing control circuit TC is raised to a high level, the address multiplexer AMX selects refresh address signals $rx0$ to $rxi$ supplied from a refresh address counter REFC and transmits them to the row address buffer RADB as row address signals. In a normal memory access mode in which the timing signal $\phi ref$ is placed at a low level, the address multiplexer AMX selects the X-address signals AX0 to AXi supplied through the external terminals A0 to Ai and transmits them to the row address buffer RADB as row address signals.

The refresh address counter REFC is, in the automatic refresh mode of the dynamic type RAM, advanced step by step in accordance with the timing signal $\phi c$ supplied from the timing control circuit TC to form refresh address signals $rx0$ to $rxi$ used to successively designate word lines which are to be refreshed. These refresh address signals $rx0$ to $rxi$ are supplied as being one set of input signals input to the above-described address multiplexer AMX.

The pair of complementary common data lines CD and $\overline{CD}$ to which a pair of complementary data lines are selectively connected by the operation of the column switch CSW are coupled to input terminals of a main amplifier MA and also to output terminals of a data input buffer DIB. Output terminals of the main amplifier MA are coupled to input terminals of a data output buffer DOB, and an output terminal of the data output buffer DOB is coupled to the data output terminal DO. An input terminal of the data input buffer DIB is coupled to the data input terminal DI.

The main amplifier MA amplifies a binary read signal which is read out from a selected memory cell in the memory array M-ARY and which is output through the corresponding pair of complementary data lines and the complementary common data lines CD, $\overline{CD}$, and transmits the amplified signal to the data output buffer DOB.

When the dynamic type RAM is set in a normal read operation mode, the data output buffer DOB is selectively activated in accordance with the timing signal φr supplied from the timing control circuit TC. The data output buffer DOB, when activated, delivers the signal read out from a selected memory cell and transmitted from the main amplifier MA to an external device through the data output terminal DO. When the dynamic type RAM is in a predetermined test mode, the data output buffer DOB delivers the timing signal φr itself to an external testing device from the data output terminal DO. For this purpose, the data output buffer DOB is supplied with the timing signal φr and the above-described internal control signal tm from the timing control circuit TC. The timing signal φr is raised to a high level when the dynamic type RAM is in a select state in the read operation mode and the operation of amplifying a read signal output from a selected memory cell is completed in the main amplifier MA. When both the internal control signal tm and the timing signal φr are placed at respective low levels, the output of the data output buffer DOB is brought into a high impedance state.

A specific arrangement and operation of the data output buffer DOB will be described later in detail.

The data input buffer DIB is, when the dynamic type RAM is in a normal write operation mode, selectively activated in accordance with the timing signal φw supplied from the timing control circuit TC. The data input buffer DIB, when activated, forms into complementary write signals write data which is supplied from an external device through the data input terminal DI, and supplies them to the complementary common data lines CD and $\overline{CD}$, respectively. When the dynamic type RAM is set in a predetermined test mode, the data input buffer DIB delivers the timing signal φw itself to an external testing device through the data input terminal DI. Therefore, the data input buffer DIB is supplied with the timing signal φw and the above-described internal control signal tm from the timing control circuit TC. The timing signal φw is temporarily raised to a high level when the dynamic type RAM is in a select state in the write operation mode and the operation of selecting a designated memory cell is completed. When both the internal control signal tm and the timing signal φw are placed at respective low levels, the output of the data input buffer DIB is brought into a high impedance state.

The timing control circuit TC forms the above-described various timing signals on the basis of the control signals supplied from an external device, i.e., the row address strobe signal $\overline{RAS}$, the column address strobe signal $\overline{CAS}$ and the write enable signal $\overline{WE}$. The timing control circuit TC further forms the above-described internal control signal tm on the basis of the test mode signal $\overline{TM}$ which is supplied from an external testing device when the dynamic type RAM is in a predetermined test mode. The timing signals and the internal control signal are supplied to various circuits to control the operation of each circuit. When the test mode signal $\overline{TM}$ is set at the low level and the dynamic type RAM is thereby brought into a predetermined test mode, the internal control signal tm is raised to the high level. In consequence, the timing signals formed by the timing control circuit TC are supplied to the respective circuits through normal signal paths and also delivered to an external testing device from the column address buffer CADB, the data output buffer DOB and the data input buffer DIB through the external terminals A0 to Ai, the data output terminal DO and the data input terminal DI.

Figure 2:
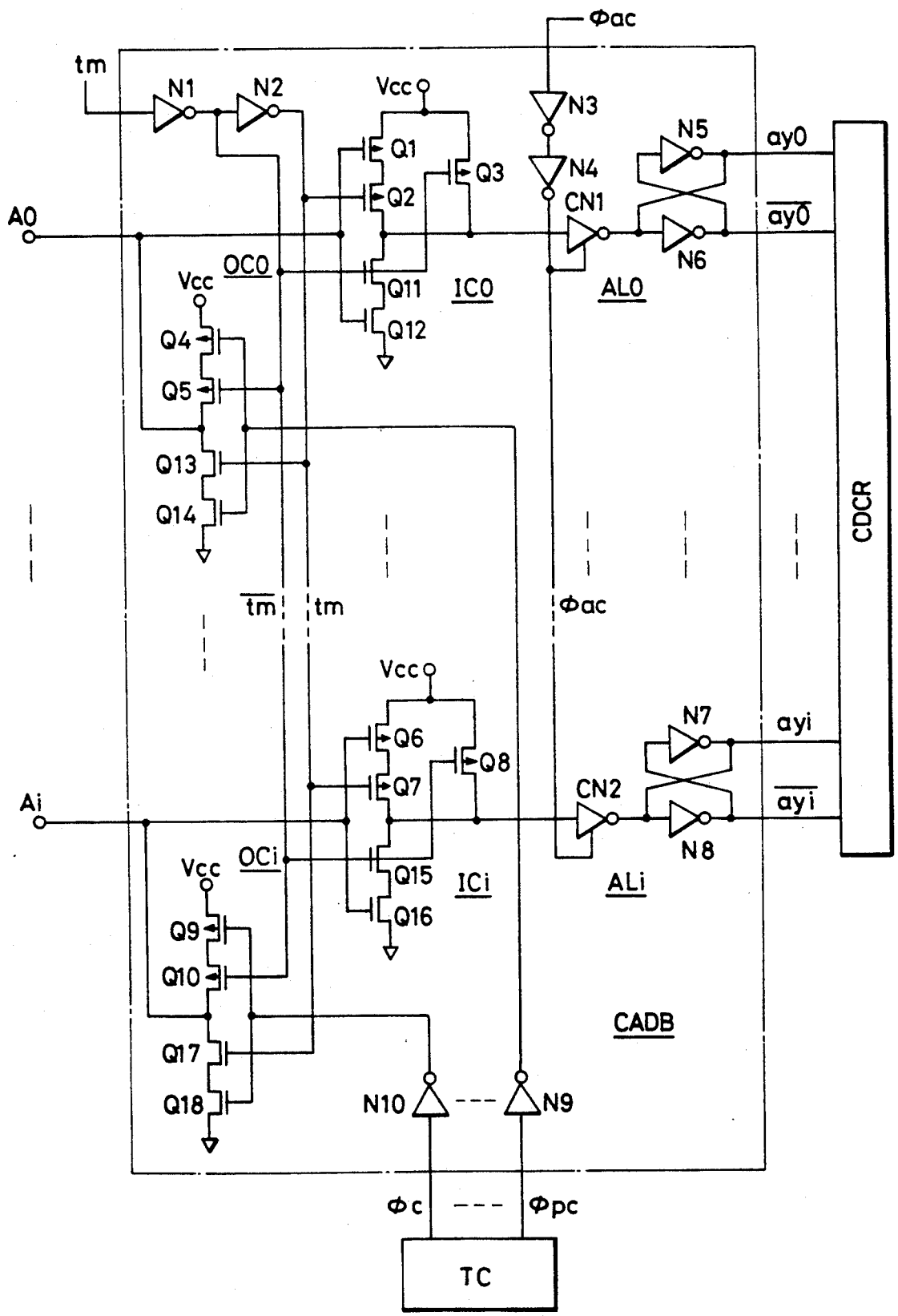
FIG. 2 is a circuit diagram of one example of the column address buffer employed in the dynamic type RAM shown in FIG. 1.

FIG. 2 is a circuit diagram showing one example of the column address buffer CADB of the dynamic type RAM shown in FIG. 1. In the circuit diagrams of FIGS. 2 and 3, a MOSFET which has an arrow shown at its channel (back gate) portion is a p-channel MOSFET, while a MOSFET having no arrow is an N-channel MOSFET.

As described above, the column address buffer CADB of the dynamic type RAM according to this embodiment includes i+1 input circuits IC0 to ICi, address latches AL0 to ALi and output circuits OC0 to OCi in correspondence with the external terminals A0 to Ai. The input terminals of the input circuits IC0 to ICi and the output terminals of the output circuits OC0 to OCi are coupled to the corresponding external terminals A0 to Ai, respectively. The external terminals A0 to Ai are coupled to i-1 input terminals (now shown), respectively, of the address multiplexer AMX. A non-inverted output signal and an inverted output signal of each of the bits in the address latches AL0 to ALi are defined as a non-inverted signal and an inverted signal, respectively, of the corresponding one of the complementary internal address signals ay0 to ayi and are supplied to the above-described column address decoder CDCR. The column address buffer CADB is supplied with the internal control signal tm for controlling the operation mode thereof and the timing signal φac defined as a strobe signal for bringing the Y-address signals AY0 to AYi to the address latches AL0 to ALi, the signals tm and φac being supplied from the timing control circuit TC. The column address buffer CADB is further supplied with i-1 different kinds of timing signals φpc to φc in correspondence with the external terminals A0 to Ai, that is, the output circuits OC0 to OCi. FIG. 2 exemplarily shows two external terminals A0, Ai, input circuits IC0, ICi, address latches AL0, ALi and output circuit OC0, OCi, which are provided in correspondence with the external terminals A0, Ai.

Referring to FIG. 2, the input circuit IC0 of the column address buffer CADB is composed of P-channel MOSFETs Q1, Q2 and N-channel MOSFETs Q11, Q12 which are provided in series between the power supply voltage Vcc of the circuit and the ground potential of the circuit, together with a P-channel MOSFET Q3 which is provided in parallel to the MOSFETs Q1 and Q2. The gates of the MOSFETs Q1 and Q12 are mutually connected to define an input terminal of this input circuit IC0 and coupled to the corresponding external terminal A0. The gate of the MOSFET Q11 is mutually connected to the gate of the MOSFET Q3 and supplied with a signal formed by inverting the internal control signal tm through an inverter circuit N1, that is, an inverted internal control signal $\overline{tm}$. The gate of the MOSFET Q2 is supplied with a signal formed by inverting the inverted internal control signal $\overline{tm}$ through an inverter circuit N2, that is, a non-inverted internal control signal tm.

The MOSFETs Q2 and Q11 are turned OFF in a predetermined test mode of the dynamic type RAM in which the non-inverted internal control signal tm is set at the high level, while the inverted internal control signal $\overline{tm}$ is set at the low level, and the MOSFETs Q2 and Q11 are turned ON in a normal operation mode in which the non-inverted internal control signal tm is set at the low level, while the inverted internal control signal $\overline{\text{tm}}$ is set at the high level. The MOSFET Q3 is selectively turned ON when the inverted internal control signal $\overline{\text{tm}}$ is shifted to the low level, that is, when the MOSFETs Q2 and Q11 are turned OFF. When the dynamic type RAM is set in a normal operation mode with tm set at the low level, the input circuit IC0 is selectively activated to transmit the Y-address signal AY0 supplied thereto through the external terminal A0 to the corresponding address latch AL0 after inverting the signal AY0. On the other hand, when the dynamic type RAM is set in a predetermined test operation mode with internal control signal tm being at the high level, the input circuit IC0 is placed in an inoperative state, and the MOSFET Q3 is selectively turned ON, thus causing the output terminal of the input circuit IC0 to be fixed to a high level, for example, the power supply voltage Vcc. Thus, although the MOSFETs Q2 and Q11 are turned OFF when the dynamic type RAM is set in a predetermined test mode, it is possible to prevent the output terminal of the input circuit IC0 from floating.

The input circuit ICi of the column address buffer CADB is composed of P-channel MOSFETs Q6, Q7 and N-channel MOSFETs Q15, Q16 which are provided in series between the power supply voltage Vcc of the circuit and the ground potential of the circuit, together which an N-channel MOSFET Q8 which is provided in parallel with the MOSFETs Q6 and Q7, in the same way as in the case of the input circuit IC0. These MOSFETs Q6 to Q8, Q15 and Q16 function in correspondence with the MOSFETs Q1 to Q3, Q11 and Q12, respectively, of the above-described input circuit IC0. More specifically, when the dynamic type RAM is set in a normal operation mode, the input circuit ICi transmits the Y-address signal AYi supplied thereto through the corresponding external terminal Ai to the corresponding address latch ALi after inverting the signal AYi. When the dynamic type RAM is set in a predetermined test mode, the output terminal of the input circuit ICi is fixed to a high level, for example, the power supply voltage Vcc.

The input circuits IC1 to ICi-1 (not shown) of the column address buffer CADB have the same circuit configuration as that of the above-described input circuits IC0 and ICi. These input circuits IC1 to ICi-1 are selectively activated when the dynamic type RAM is set in a normal operation mode so as to transmit the Y-address signals AY1 to AYi-1 supplied thereto through the corresponding external terminals A1 to Ai-1 to the corresponding address latches AL1 to ALi-1 after inverting the signals AY1 to AYi-1.

The address latch AL0 in the column address buffer CADB is composed of a clocked inverter circuit CN1 which receives the output signal from the corresponding input circuit IC0 described above and two inverter circuits N5, N6. The input and output terminals of the inverter circuits N5 and N6 are cross-connected to each other in a latch form. The output terminal of the clocked inverter circuit CN1 is coupled to the output terminal of the inverter circuit N5, that is, the input terminal of the inverter circuit N6. The control terminal of the clocked inverter circuit CN1 is supplied with a signal formed by inverting through an inverter circuit N4 a signal which is formed by inverting the timing signal $\phi$ac through an inverter circuit N3, that is, a non-inverted timing signal $\phi$ac. The driving capacity of the clocked inverter circuit CN1 is set so as to be larger than the driving capacity of the inverter circuit N5. The output signals from the inverter circuits N5 and N6 are defined as output signals of the address latch AL0, that is, a non-inverted internal address signal ay0 and an inverted internal address signal $\overline{\text{ay0}}$, which are supplied to the above-described column address decoder CDCR.

The clocked inverter circuit CN1 of the address latch AL0 is selectively activated when the timing signal $\phi$ac is raised to the high level so as to transmit the Y-address signal AY0 transmitted thereto from the corresponding input circuit IC0 to the corresponding latch after further inverting the signal AY0. The state of the latch that is composed of the inverter circuits N5 and N6 is shifted in accordance with the Y-address signal AY0 transmitted thereto through the clocked inverter circuit CN1. When the timing signal $\phi$ac is at the low level, the clocked inverter circuit CN1 is held in an inoperative state, and the latch that is constituted by the inverter circuits N5 and N6 is held in a state which is determined in accordance with the Y-address signal AY0. In other words, when the timing signal $\phi$ac is temporarily raised to the high level, the Y-address signal AY0 which is supplied from the external terminal A0 through the input circuit IC0 is incorporated and held in the corresponding address latch AL0.

The address latch ALi in the column address buffer CADB is composed of a clocked inverter circuit CN2 and two inverter circuits N7 and N8 in the same way as in the case of the above-described address latch AL0. The clocked inverter circuit CN2 and the inverter circuits N7, N8 function in correspondence with the clocked inverter circuit CN1 and the inverter circuits N5, N6, respectively, of the address latch AL0. More specifically, when the dynamic type RAM is in a select state in a normal operation mode and the timing signal $\phi$ac is temporarily raised to the high level, the address latch ALi is activated to incorporate and hold the Y-address signal AYi which is supplied from the corresponding external terminal Ai through the corresponding input circuit ICi.

The address latches AL1 to ALi-1 (not shown) of the column address buffer CADB have the same circuit configuration as that of the above-described address latches AL0 and ALi. These address latches AL1 to ALi-1 are, in a normal operation mode of the dynamic type RAM, activated to incorporate and hold the Y-address signals AY1 to AYi-1 supplied from the corresponding external terminals A1 to Ai-1 through the corresponding input circuits IC1 to ICi-1, respectively.

The output circuit OC0 of the column address buffer CADB is composed of P-channel MOSFETs Q4, Q5 and N-channel MOSFETs Q13, Q14 which are provided in series between the power supply voltage Vcc of the circuit and the ground potential of the circuit. The gates of the MOSFETs Q4 and Q14 are mutually connected to define an input terminal of the output circuit OC0 and coupled to the output terminal of the corresponding inverter circuit N9. The input terminal of the inverter circuit N9 is supplied with the above-described timing signal $\phi$pc from the timing control circuit TC. In other words, the input terminal of the output circuit OC0 is supplied with a signal formed by inverting the timing signal $\phi$pc through the inverter circuit N9, that is, an inverted timing signal $\overline{\phi\text{pc}}$. The gate of the MOSFET Q5 is supplied with the above-described inverted internal control signal $\overline{\text{tm}}$. The gate of the MOSFET Q13 is supplied with the above-described non-inverted internal control signal tm. The drains of the MOSFETs Q5 and Q13 are mutually connected to define an output terminal of the output circuit OC0 and coupled to the corresponding external terminal A0.

The MOSFETs Q5 and Q13 are turned OFF in a normal operation mode of the dynamic type RAM in which the inverted internal control signal $\overline{tm}$ is set at the high level and the non-inverted internal control signal tm is set at the low level, and the MOSFETs Q5 and Q13 are turned ON in a predetermined test mode of the dynamic type RAM in which the inverted internal control signal $\overline{tm}$ is set at the low level and the non-inverted internal control signal tm is set at the high level. Thus, when the dynamic type RAM is set in a predetermined test mode, the output circuit OC0 is selectively activated to further invert the inverted timing signal $\overline{\phi pc}$ supplied thereto through the corresponding inverter circuit N9 and deliver the signal to an external testing device through the corresponding external terminal A0. In other words, when the dynamic type RAM is set in a predetermined test mode, a signal which is transmitted to the corresponding predetermined internal node of the timing control circuit TC, that is, the timing signal $\phi pc$, is output to the external terminal A0. When the dynamic type RAM is set in a normal operation mode with the internal signal tm being set to a low level, the output of the output circuit OC0 is placed in a high impedance state.

The output circuit OCi of the column address buffer CADB is composed of P-channel MOSFETs Q9, Q10 and N-channel MOSFETs Q17, Q18 which are provided in series between the power supply voltage Vcc of the circuit and the ground potential of the circuit in the same way as in the case of the above-described output circuit OC0. These MOSFETs Q9, Q10, Q17, Q18 function in correspondence with the MOSFETs Q4, Q5, Q13, Q14, respectively, of the output circuit OC0. More specifically, when the dynamic type RAM is set in a predetermined test mode, the output circuit OCi delivers a signal which is transmitted to the corresponding predetermined internal node of the timing control circuit TC, that is, the timing signal $\phi c$, to an external testing device through the corresponding external terminal Ai. When the dynamic type RAM is set in a normal operation mode, the output of the output circuit OCi is placed in a high impedance state.

The output circuits OC1 to OCi-1 (not shown) of the column address buffer CADB have the same circuit configuration as that of the above-described output circuits OC0 and OCi. These output circuits OC1 to OCi-1 are selectively activated when the dynamic type RAM is set in a predetermined test mode so as to deliver signals which are transmitted to the corresponding predetermined internal nodes of the timing control circuit TC, that is, the timing signals, e.g., $\phi ar$, $\phi ac$, $\phi x$, $\phi pal$, $\phi pa2$, $\phi y$ and $\phi ref$, to an external testing device through the corresponding external terminals A1 to Ai-1, respectively. When the dynamic type RAM is set in a normal operation mode, the outputs of these output circuits OC1 to OCi-1 are placed in a high impedance state.

Although not necessarily limiting, the aforementioned data input buffer DIB also has input and output circuits having arrangements similar to those of the circuits IC0 to ICi and the output circuit OC0 to OCi in the above-described column address buffer CADB and also includes a data latch arranged in the same way as in the case of the address latches AL0 to ALi. The data input buffer DIB is supplied with the above-described internal control signal tm for controlling the operation mode thereof and the timing signal $\phi w$ for controlling the operation timing thereof, the signals tm and $\phi w$ being supplied from the timing control circuit TC. More specifically, when the dynamic type RAM is set in a normal operation mode and the internal control signal tm is set at the low level, the data input buffer DIB forms write data supplied through the data input terminal DI into complementary write signals and transmits them to the complementary common data lines CD and $\overline{CD}$ in accordance with the timing signal $\phi w$. At this time, the output of the output circuit in the data input buffer DIB is placed in a high impedance state. On the other hand, when the dynamic type RAM is set in a predetermined test mode and the internal control signal tm is raised to the high level, the data input buffer DIB delivers the timing signal $\phi w$ itself to an external testing device from the data input terminal DI. At this time, the input circuit of the data input buffer DIB is placed in an inoperative state.

Figure 3:
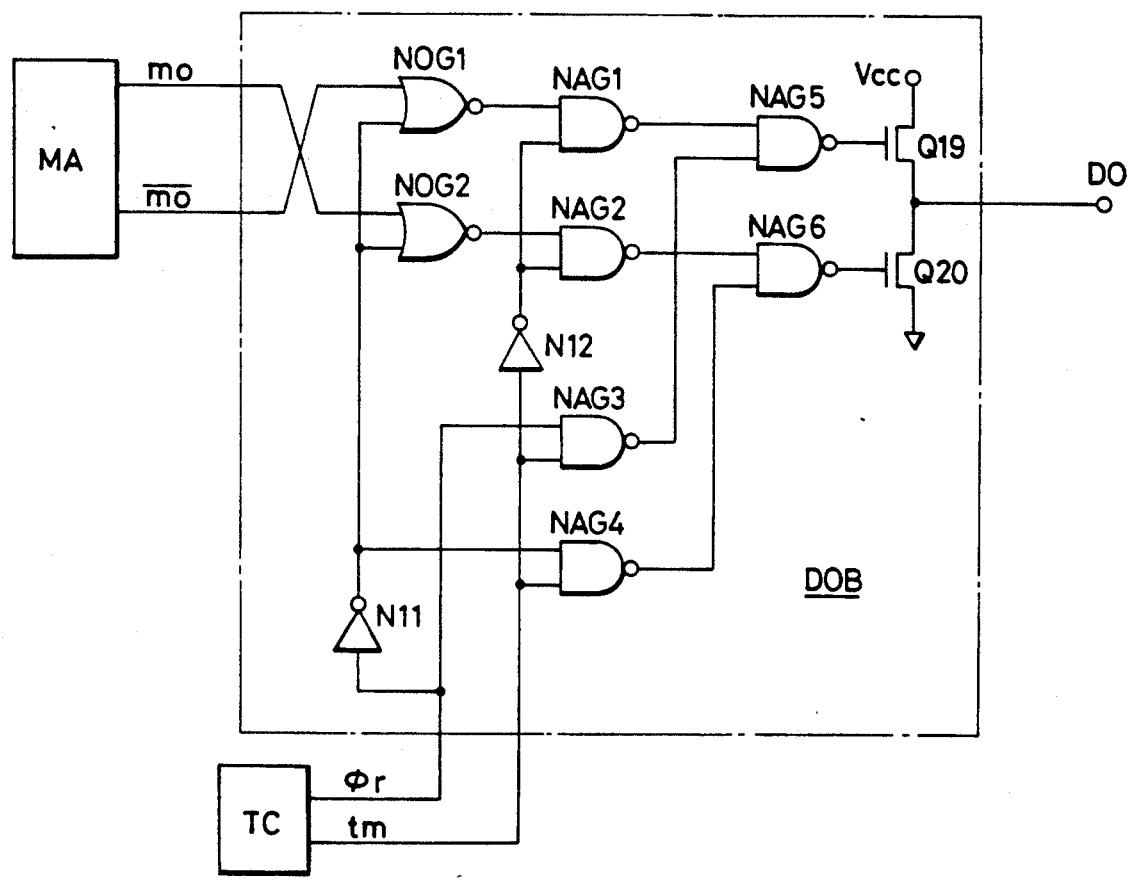
FIG. 3 is a circuit diagram of one example of the data output buffer employed in the dynamic type RAM shown in 1.

FIG. 3 is a circuit diagram showing one example of the data output buffer DOB of the dynamic type RAM.

Referring to FIG. 3, complementary read signals mo and $\overline{mo}$ which are output from a selected memory cell and amplified by the main amplifier MA are supplied to first input terminals of NOR gate circuits NOG2 and NOG1, respectively, in the data output buffer DOB. The other or second input terminals of the NOR gate circuits NOG1 and NOG2 are mutually supplied with a signal formed by inverting through an inverter circuit N11 the timing signal $\phi r$ which is supplied from the timing control circuit TC, that is, an inverted timing signal $\overline{\phi r}$. This timing signal $\overline{\phi r}$ is normally placed at a low level but raised to a high level when the dynamic type RAM is in a select state and the operation of amplifying the read signal output from a selected memory cell is completed in the main amplifier MA.

Thus, the output signal from the NOR gate NOG1 is selectively raised to a high level when both the inverted read signal $\overline{mo}$ and the inverted timing signal $\overline{\phi r}$ are at their respective low levels, that is, when the timing signal $\overline{\phi r}$ is at the high level and a signal of logic "1" is output from a selected memory cell. Similarly, the output signal from the NOR gate circuit NOG2 is selectively raised to a high level when both the non-inverted read signal mo and the inverted timing signal $\overline{\phi r}$ are at their respective low levels, that is, when the timing signal $\phi r$ is at the high level and a signal of logic "0" is output from a selected memory cell.

The output signal from the NOR gate NOG1 is supplied to one input terminal of a NAND gate circuit NAG1. The output signal from the NOR gate circuit NOG2 is supplied to one input terminal of a NAND gate circuit NAG2. The other input terminals of these NAND gate circuits NAG1 and NAG2 are mutually supplied with a signal formed by inverting through an inverter circuit N12 the internal control signal tm which is supplied from the timing control circuit TC, that is, the inverted internal control signal $\overline{tm}$.

Thus, the output signal from the NAND gate circuit NAG1 is selectively shifted to a low level when both the output signal from the NOR gate circuit NOG1 and the inverted internal control signal $\overline{tm}$ are raised to their respective high levels, that is, when the dynamic type RAM is set in a normal read operation mode and a read signal of logic "1" is output at the output timing thereof. Similarly, the output signal from the NAND gate circuit NAG2 is selectively shifted to a low level when both the output signal from the NOR gate circuit NOG2 and the inverted internal control signal $\overline{tm}$ are raised to their respective high levels, that is, when the dynamic type RAM is set in a normal read operation mode and a read signal of logic "0" is output at the output timing thereof. The output signals from the NAND gate circuits NAG1 and NAG2 are supplied to first input terminals of NAND gate circuits NAG5 and NAG6 respectively.

A NAND gate circuit NAG3 is supplied at one input terminal thereof with the above-described timing signal $\phi r$. A NAND gate circuit NAG4 is supplied at one input terminal thereof with a signal formed by inverting the timing signal $\overline{\phi r}$, that is, the inverted timing signal $\phi r$ The other input terminals of these NAND gate circuits NAG3 and NAG4 are mutually supplied with the above-described internal control signal tm.

Thus, the output signal from the NAND gate circuit NAG3 is selectively shifted to a low level when both the timing signal $\phi r$ and the internal control signal tm are raised to their respective high levels, that is, when the dynamic type RAM is set in a predetermined test mode and the timing signal $\phi r$ is raised to the high level. Similarly, the output signal from the NAND gate circuit NAG4 is selectively shifted to a low level when both the inverted timing signal $\overline{\phi r}$ and the internal control signal tm are raised to their respective high levels, that is, when the dynamic type RAM is set in a predetermined test mode and the timing signal $\phi r$ is shifted to the low level. The output signals from the NAND gate circuits NAG3 and NAG4 are supplied to the other input input terminals of the above-described NAND gate circuits NAG5 and NAG6, respectively.

Thus, the output signal from the NAND gate circuit NAG5 is selectively raised to a high level when the output signal from either the NAND gate circuit NAG1 or NAG3 is shifted to the low level, that is, when the dynamic type RAM is set in a normal read operation mode and read data of logic "1" is output, or when the dynamic type RAM is set in a predetermined test mode and the timing signal $\phi r$ is raised to the high level. The output signal from the NAND circuit NAG5 is supplied to the gate of a MOSFET Q19. Similarly, the output signal from the NAND gate circuit NAG6 is selectively raised to a high level when the output signal from either the NAND gate circuit NAG2 or NAG4 is shifted to the low level, that is, when the dynamic type RAM is set in a normal read operation mode and u read data of logic "0" is output, or when the dynamic type RAM is set in a predetermined test mode and the timing signal $\phi r$ is shifted to the low level. The output signal from the NAND gate circuit NAG6 is supplied to the gate of a MOSFET Q20.

The drain of the MOSFET 19 is coupled to the power supply voltage Vcc of the circuit, while the source of the MOSFET Q20 is coupled to the ground potential of the circuit. The source of the MOSFET Q19 and the drain of the MOSFET Q20 are mutually connected and coupled to the data output terminal D0. These MOSFETs Q19 and Q20 are designed so as to have a relatively large conductance and a relatively large driving capacity. Thus, the MOSFETs Q19 and Q20 function as output MOSFETs which constitute in combination a push-pull type output circuit.

The MOSFET Q19 is normally OFF but selectively turned ON when the output signal from the NAND gate circuit NAG5 is raised to the high level, that is, when read data of logic "1" is output in a normal read operation of the dynamic type RAM, or when the timing signal $\phi r$ is raised to the high level in a predetermined test mode of the dynamic type RAM. When the MOSFET Q19 is turned ON, a high-level output signal is delivered to the data output terminal DO. Similarly, the MOSFET Q20 is normally OFF but selectively turned ON when the output signal from the NAND gate circuit NAG6 is raised to the high level, that is, when read data of logic "0" is output in a normal read operation mode of the dynamic type RAM, or when the timing signal $\phi r$ is shifted to the low level in a predetermined test mode of the dynamic type RAM. When the MOSFET Q20 is turned ON, a low-level output signal is delivered to the data output terminal DO. In other words, when the dynamic type RAM is set in a normal read operation mode, the data output buffer DOB is selectively activated in accordance with the timing signal $\phi r$ to deliver an output signal according to the read data to an external device from the data output terminal DO. On the other hand, when the dynamic type RAM is set in a predetermined test mode, the data output buffer DOB is selectively activated in accordance with the internal control signal tm to deliver a signal transmitted to a predetermined internal node in the timing control circuit TC, that is, the timing signal $\phi r$, to an external testing device through the data output terminal Do.

As described above, in the dynamic type RAM according to this embodiment, a plurality of timing signals formed by the timing control circuit TC are supplied to the column address buffer CADB, the data input buffer DIB and the data output buffer DOB. The column address buffer CADB and the data input buffer DIB are provided with output circuits in addition to ordinary input circuits, and the data output buffer DOB is adapted to select an output signal in accordance with the internal control signal tm. When the test mode signal $\overline{TM}$ is shifted to the low level and the dynamic type RAM is thereby set in a predetermined test mode, the timing control circuit TC forms the above-described timing signals in accordance with the row address strobe signal $\overline{RAS}$, the column address strobe signal $\overline{CAS}$ and the write enable signal $\overline{WE}$ in the same way as in the case of a normal operation mode. These timing signals are supplied to the column address buffer CADB, the data input buffer DIB and the data output buffer DOB and further delivered to an external testing device through the address input external terminals A0 to Ai, the data input terminal DI and the data output terminal DO. Thus, the dynamic type RAM of this embodiment enables the operating state of the timing control circuit TC or a peripheral circuit thereof to be accurately confirmed from the outside. Accordingly, it is possible to efficiently carry out a functional test of the dynamic type RAM, mainly on the timing control circuit TC, a failure diagnosis and measurement of operating margin or the like after the completion of the product.

It should be noted that it is possible to carry out the operation test of the above-described timing control circuit TC even more completely by variously setting the combination of the input timings or pulse widths of the input signals $\overline{RAS}$, $\overline{CAS}$ and $\overline{WE}$ to the timing control circuit TC. Since the timing control circuit TC is a logic circuit, an output signal therefrom is in one-to-one correspondence with an input signal thereto. Accordingly, it is possible to carry out a logic test on the timing control circuit TC by measuring an output signal with respect to a certain input signal and comparing it with the design expected value. In this case, it is possible to make more perfect the testing of the timing control circuit TC by increasing the number of combinations of a plurality of input signals and thus increasing the number of times of the above-described comparison. Such testing method enables finding of a defect which has heretofore been unable to be found by the conventional test, for example, by using a short-circuit between wirings.

As shown in the foregoing embodiment, the following advantageous effects are obtained when the present invention is applied to a semiconductor memory, for example, a dynamic type RAM incorporating a timing control circuit (i.e., a timing generating circuit) or the like:

(1) In a semiconductor memory, for example, a dynamic type RAM, various timing signals which are formed by a timing control circuit or the like are supplied to an address input buffer and data input and output buffers, and these circuits are provided with a function whereby the above-described timing signals are delivered from the corresponding external terminals when the dynamic type RAM is set in a predetermined operation mode, thereby advantageously enabling the states of signals transmitted to internal nodes in the timing control circuit and a peripheral circuit thereof to be accurately confirmed from the outside.

(2) The advantage (1) enables an operation test to be efficiently carried out on a relatively advanced multi-functional semiconductor memory, for example, a dynamic type RAM, so that it is advantageously possible to reduce the time required for the functional test.

(3) By virtue of the advantage (1), it is possible to efficiently carry out a failure analysis and measurement of operating margin or the like after the completion of a semiconductor memory such as a dynamic type RAM or the like.

(4) By virtue of the advantages (1) to (3), it is possible to lower the testing cost for a semiconductor memory such as a dynamic type RAM or the like and enhance the reliability of the memory.

Although the present invention has been specifically described above by way of one embodiment, it should be noted here that the invention is not necessarily limited to the described embodiment and various changes and modifications may, of course, be imparted thereto without departing from the gist of the invention. For example, although in the dynamic type RAM of the described embodiment the test mode signal $\overline{TM}$ is provided and a test mode is designated (by setting the test mode signal $\overline{TM}$ to a low level, the test mode may also be designated, for example, by setting an input voltage to a specific address input external terminal at high voltage or setting a combination of control signals in a CBR ($\overline{CAS}$ Before $\overline{RAS}$) mode. The timing signals that are output in the test mode may be input to a testing device through the corresponding bonding pads in place of the corresponding external terminals. Although in the embodiment shown in FIG. 1 the output circuits of the column address buffer CADB and the data input buffer DIB are arranged in the form of clocked inverter type circuits, these output circuits may be defined by push-pull type output circuits in the same way as in the case of the data output buffer DOB. Further, an input protect circuit may be provided between the input circuits and the corresponding external terminals. The signals that are output through the external terminals are not necessarily limited to the timing signals formed by the timing control circuit TC as in the case of the foregoing arrangement, but they may be various kinds of signals which are transmitted to internal nodes in other circuits, for example, an internal arithmetic circuit and other function control circuits. If there is some room to provide additional external terminals, it is possible to provide output terminals employed exclusively for outputting signals transmitted to internal nodes. Further, it is possible to adopt various embodiment forms with respect to the block arrangement of the dynamic type RAM shown in FIG. 1, specific circuit configurations of the column address buffer CADB and the data output buffer DOB which are shown in FIGS. 2 and 3, and the combination of various control signals and address signals shown in FIG. 4.

Although the invention accomplished by the present inventors has been mainly described above applied to a dynamic type RAM which is the applicable field thereof, the present invention is not necessarily limited thereto but may also be applied to other types of memory, for example, static type RAMs and various kinds of read-only memory. The present invention may be widely applied to semiconductor memory devices having at least a relatively complicated internal logic circuit such as a timing control circuit (i.e., a timing generating circuit) or the like.

What is claimed is:

1. A semiconductor memory comprising:
   a memory array including therein a plurality of memory cells for storing data;
   select means coupled to said memory array for selecting at least one memory cell from said plurality of memory cells;
   control means coupled to said select means for forming at least one internal control signal for controlling said select means; .
   a first external terminal coupled to said select means; and
   control signal transmitting means for transmitting said at least one internal control signal to said first external terminal under predetermined conditions to permit external monitoring of said internal control signal.

2. A semiconductor memory according to claim 1, wherein said first external terminal is an address signal input terminal, said select means including an address buffer circuit for forming address complementary signals on the basis of an address signal supplied thereto from said address signal input terminal.

3. A semiconductor memory according to claim 2, wherein said control signal transmitting means includes an output circuit which is coupled at an output terminal thereof to said first external terminal and which is coupled at an input terminal thereof to an output terminal of said control means.

4. A semiconductor memory according to claim 3, wherein said output circuit includes a tri-state circuit the output state of which is brought into a high impedance state on the basis of a predetermined output circuit control signal.

5. A semiconductor memory according to claim 4, wherein said output circuit control signal is formed in said control means.

6. A semiconductor memory according to claim 5, wherein said control means forms said at least one internal control signal on the basis of at least one external control signal.

7. A semiconductor memory according to claim 6, wherein said at least one external control signal is supplied from a second external terminal which is coupled to said control means.

8. A semiconductor memory device according to claim 1, wherein said predetermined conditions include the detection of the semiconductor memory being placed in a test mode.

9. A semiconductor memory comprising:
a memory array including therein a plurality of memory cells;
a peripheral circuit coupled to said memory array which executes either an information write or read operation with respect to one or more memory cells selected from said plurality of memory cells;
a timing control circuit coupled to said peripheral circuit which forms at least one internal control signal for controlling said peripheral circuit; and
at least one external terminal coupled to said peripheral circuit for delivering said at least one internal control signal to the outside of said semiconductor memory under predetermined conditions to permit external monitoring of said internal control signal,
wherein said peripheral circuit has a memory cell select function for selecting at least one memory cell from said plurality of memory cells, and
wherein said peripheral circuit has an output function for outputting data stored in said at least one memory cell form said external terminal.

10. A semiconductor memory according to claim 9, wherein said peripheral circuit has an output select function for selectively outputting either data stored in said at least one memory cell or at least one internal control signal to said external terminal.

11. A semiconductor memory comprising:
a memory array including therein a plurality of memory cells;
a peripheral circuit coupled to said memory array which executes either an information write or read operation with respect to one or more memory cells selected from said plurality of memory cells;
a timing control circuit coupled to said peripheral circuit which forms at least one internal control signal for controlling said peripheral circuit; and
at least one external terminal coupled to said peripheral circuit for delivering said at least one internal control signal to the outside of said semiconductor memory under predetermined conditions to permit external monitoring of said internal control signal,
wherein said peripheral circuit has a memory cell select function for selecting at least one memory cell from said plurality of memory cells, and
wherein said peripheral circuit has a data input function for inputting data which is to be stored in said at least one memory cell from said external terminal.

12. A semiconductor memory according to claim 11, wherein said peripheral circuit has a control signal output function for outputting a control signal to said external terminal.

13. A semiconductor memory comprising:
a memory array including a plurality of memory cells for storing data;
a plurality of address signal input terminals supplied with address signals, respectively, for selecting at least one of said memory cells;
at least one data output terminal for delivering internal data stored in at least one of the memory cells in the semiconductor memory to the outside of the semiconductor memory;
a plurality of external signal input terminals supplied with external control signals, respectively;
a timing control circuit coupled to said plurality of external signal input terminals for forming a plurality of internal control signals for the semiconductor memory on the basis of the external control signal;
a first output circuit coupled to said timing control circuit for delivering at least one of the internal control signals to at least one address signal input terminal under predetermined conditions to permit external monitoring of said at least one of the internal control signals; and
a second output circuit coupled to said timing control circuit for delivering at least one of the internal control signals to said at least one data output terminal under predetermined conditions to permit external monitoring of said at least one of the internal control signals.

14. A semiconductor memory device according to claim 1, wherein said predetermined conditions include the detection of the semiconductor memory being placed in a test mode.

15. A semiconductor memory according to claim 14, wherein said first output circuit includes an output terminal coupled to at least one address signal input terminal, and further includes an input terminal coupled to an output terminal of said timing control circuit.

16. A semiconductor memory according to claim 15, wherein said first output circuit includes a tri-state circuit the output state of which is brought into a high impedance state on the basis of a predetermined output circuit control signal.

17. A semiconductor memory according to claim 16, wherein said output circuit control signal is formed in said timing control circuit.

18. A semiconductor memory according to claim 14, wherein said second output circuit is coupled at an output terminal thereof to said at least one data output terminal and at an input terminal thereof to an output terminal of said timing control circuit.

19. A semiconductor memory according to claim 18, wherein said second output circuit delivers at least one of the internal control signals to said at least one data output terminal on the basis of a predetermined output circuit control signal.

20. A semiconductor memory according to claim 19, wherein said output circuit control signal is formed in said timing control circuit.

21. A semiconductor memory comprising:
a memory array including therein a plurality of memory cells for storing data;
select means coupled to said memory array for selecting at least one memory cell from said plurality of memory cells;
control means coupled to said select means for forming at least one internal control signal for controlling said select means;
a first external terminal coupled to said select means;
output means coupled to said first external terminal and coupled to receive said at least one internal control signal; and
means for providing a test mode signal to said output means, wherein said output means is responsive to said test mode signal for transmitting said at least one internal control signal to said first external terminal to provide a test indication outside of said semiconductor memory regarding said at least one internal control signal.

22. A semiconductor memory according to claim 21, wherein said first external terminal is an address signal input terminal, said select means including an address buffer circuit for forming address complementary signals on the basis of an address signal supplied thereto from said address signal input terminal 23. A semiconductor memory according to claim 21, wherein said output means includes a tri-state circuit, the output state of which is brought into a high impedance state on the base of a predetermined level of said test mode signal.

24. A semiconductor memory according to claim 21, wherein said test mode signal provided to said output means is formed in said control means.

25. A semiconductor memory according to claim 24, wherein said control means forms said at least one internal control signal on the basis of at least one external control signal.

26. A semiconductor memory according to claim 25, wherein said at least one external control signal is supplied from a second external terminal which is coupled to said control means.

27. A semiconductor memory according to claim 21, wherein said output means is formed as a portion of said select means.

28. A semiconductor memory comprising:
a memory array including a plurality of memory cells;
a peripheral circuit coupled to said memory array which executes either an information write or read operation with respect to one or more memory cells selected from said plurality of memory cells;
a timing control circuit coupled to said peripheral circuit which forms at least one internal control signal for controlling said peripheral circuit;
at least one external terminal coupled to said peripheral circuit;
output means coupled to said at least one external terminal and coupled to receive said at least one internal control signal; and
means for providing a test mode signal to said output means,
wherein said output means is responsive to said test mode signal for transmitting said at least one internal control signal to said at least one external terminal to provide a test indication outside of said semiconductor memory regarding said at lest one internal control signal,
wherein said peripheral circuit has a memory cell select function for selecting at least one memory cell from said plurality of memory cells, and
wherein said peripheral circuit has an output function for outputting data stored in said at least one memory cell from said external terminal.

29. A semiconductor memory according to claim 28, where said peripheral circuit has an output select function for selectively outputting either data stored in said at least one memory cell or said at least one internal control signal to said external terminal.

30. A semiconductor memory comprising:
a memory array including a plurality of memory cells;
a peripheral circuit coupled to said memory array which executes either an information write or read operation with respect to one or more memory cells selected from said plurality of memory cells;
a timing control circuit coupled to said peripheral circuit which forms at least one internal control signal for controlling said peripheral circuit;
at least one external terminal coupled to said peripheral circuit;
output means coupled to said at least one external terminal and coupled to receive said at least one internal control signal; and
means for providing a test mode signal to said output means,
wherein said output means is responsive to said test mode signal for transmitting said at least one internal control signal to said at least one external terminal to provide a test indication outside of said semiconductor memory regarding said at lest one internal control signal,
wherein said peripheral circuit has a memory cell select function for selecting at least one memory cell from said plurality of memory cells, and
wherein said peripheral circuit has an output function for outputting data stored in said at least one memory cell from said external terminal.

* * * * *